United States Patent
Yeh et al.

(10) Patent No.: US 9,621,216 B1
(45) Date of Patent: Apr. 11, 2017

(54) COVER AND ELECTRONIC DEVICE HAVING SAME

(71) Applicants: NANNING FUGUI PRECISION INDUSTRIAL CO., LTD., Nanning (CN); HON HAI PRECISION INDUSTRY CO., LTD., New Taipei (TW)

(72) Inventors: Chun-Hung Yeh, New Taipei (TW); Ruei-Yun Hung, New Taipei (TW); Sheng-Hsiung Yang, New Taipei (TW)

(73) Assignees: NANNING FUGUI PRECISION INDUSTRIAL CO., LTD., Nanning (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 15/075,974

(22) Filed: Mar. 21, 2016

(30) Foreign Application Priority Data

Feb. 1, 2016 (TW) .............................. 105103074 A

(51) Int. Cl.
*H04M 1/00* (2006.01)
*H04B 1/08* (2006.01)
*H04B 1/3888* (2015.01)
*H05K 9/00* (2006.01)
*H01R 13/658* (2011.01)
*H05K 5/04* (2006.01)

(52) U.S. Cl.
CPC ..... *H04B 1/3888* (2013.01); *H01R 13/65802* (2013.01); *H05K 5/04* (2013.01); *H05K 9/0084* (2013.01)

(58) Field of Classification Search
CPC .......... H01R 13/65802; H01R 13/6596; H05K 5/04; H05K 9/0081; H05K 9/0084
USPC .......... 455/575.1, 575.8, 347, 348, 349, 351
See application file for complete search history.

(56) References Cited

U.S. PATENT DOCUMENTS

| | | | |
|---|---|---|---|
| 6,508,670 B1 * | 1/2003 | Hwang | H01R 13/65802 439/108 |
| 2001/0024551 A1 * | 9/2001 | Yonemura | G02B 6/4246 385/88 |
| 2003/0000725 A1 * | 1/2003 | Huang | H01R 12/7082 174/53 |
| 2003/0100204 A1 * | 5/2003 | Hwang | H01R 13/65802 439/92 |
| 2004/0037517 A1 * | 2/2004 | Dair | G02B 6/4292 385/92 |
| 2004/0116165 A1 * | 6/2004 | Huang | H04B 15/02 455/575.1 |
| 2004/0223700 A1 * | 11/2004 | Cheng | G02B 6/4201 385/53 |

(Continued)

FOREIGN PATENT DOCUMENTS

| | | |
|---|---|---|
| CN | 101686630 A | 3/2010 |
| TW | M262883 | 4/2005 |

*Primary Examiner* — Duc M Nguyen
(74) *Attorney, Agent, or Firm* — Zhigang Ma

(57) ABSTRACT

A cover configured to cover a base of an electronic device. The cover includes a plurality of sidewalls, a plurality of limiting portions and a plurality of bent portions. The limiting portions are arranged on the sidewalls and protruding inwardly to latch to the base. The bent portions are arranged on the sidewalls and extending outwardly to contact ground portions of the electronic device. An electronic device employing the cover is also provided.

20 Claims, 2 Drawing Sheets

(56) References Cited

U.S. PATENT DOCUMENTS

| | | | |
|---|---|---|---|
| 2007/0293282 A1* | 12/2007 | Lewis | H04M 1/0252 455/575.1 |
| 2009/0114439 A1* | 5/2009 | Su | H01R 12/585 174/372 |
| 2009/0116185 A1* | 5/2009 | Su | G02B 6/4201 361/688 |
| 2010/0079972 A1 | 4/2010 | Chen et al. | |
| 2010/0259891 A1* | 10/2010 | Tachikawa | G06F 1/1688 361/679.55 |
| 2011/0003623 A1* | 1/2011 | Na | H01Q 1/243 455/575.1 |

* cited by examiner

COVER AND ELECTRONIC DEVICE HAVING SAME

FIELD

The subject matter herein generally relates to a cover providing grounding for an electronic device and an electronic device having the cover.

BACKGROUND

Electronic devices such as Wi-Fi Access Point (AP) device and 3G smallcell device, may easily affected by noise when receiving signals. Normally, adding a shielding assembly to the electronic device and changing a circuit arrangement to archive circuit matching decreases noise affection. However, the matching value of the elements of the circuit is limited and the added shielding elements increase design time and cost.

BRIEF DESCRIPTION OF THE DRAWINGS

Many aspects of the disclosure can be better understood with reference to the following figures. The components in the figures are not necessarily drawn to scale, the emphasis instead being placed upon clearly illustrating the principles of the disclosure. Moreover, in the drawings, like reference numerals designate corresponding parts throughout the several views.

DETAILED DESCRIPTION

Figure 1:
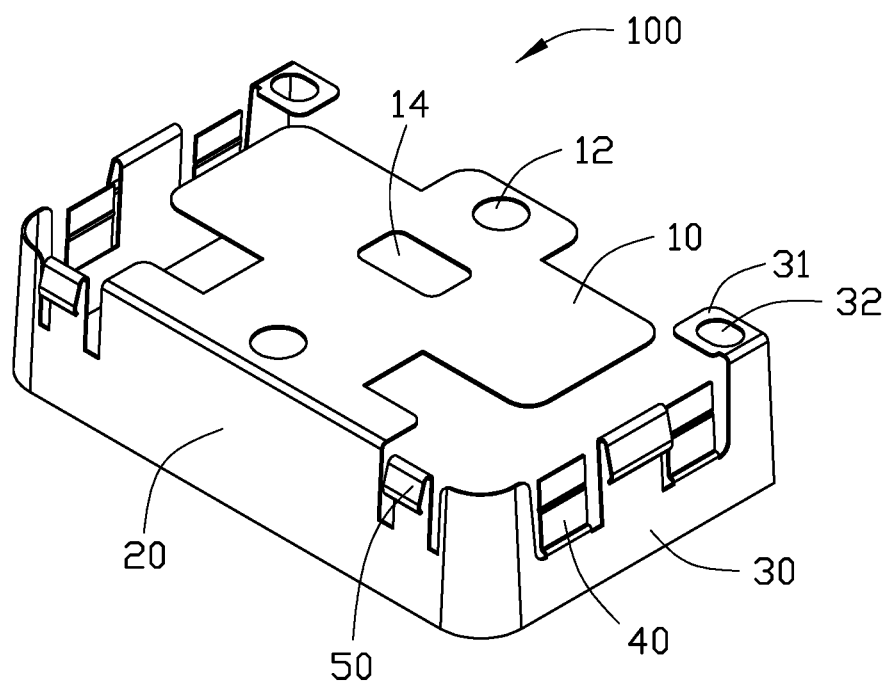
FIG. 1 is an isometric view of one embodiment of a cover.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series and the like.

FIG. 1 illustrates one embodiment of a cover 100 applied in an electronic device. The electronic device can be a Wi-Fi Access Point (AP) device and a 3G small cell device.

Figure 2:
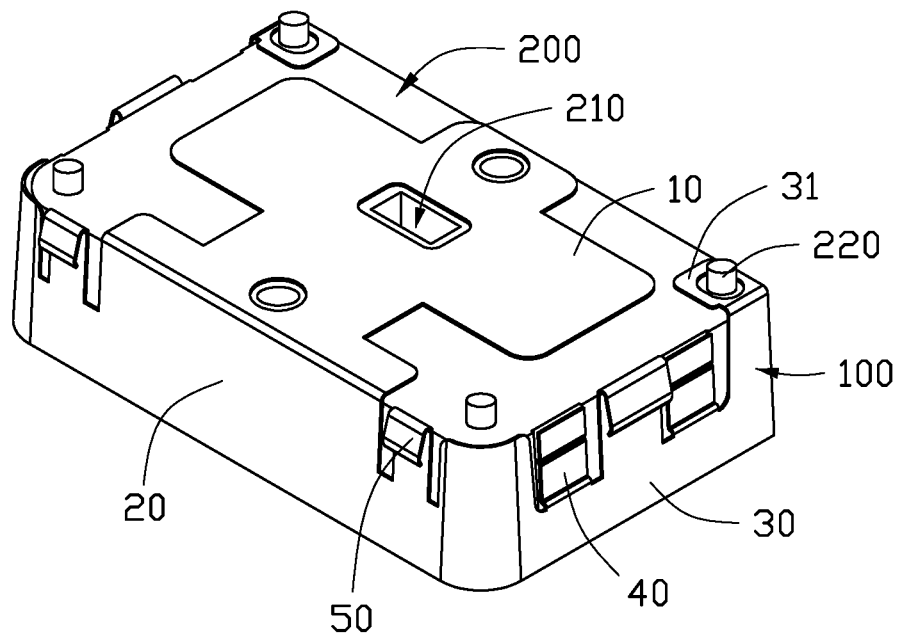
FIG. 2 is an isometric view of one embodiment of the cover shown in FIG. 1 covering a base of an electronic device.

FIGS. 1 and 2 illustrate that the cover 100 is substantially a rectangular frame having an opening. The cover 100 is made of metal material and made by integral molding technology. The cover 100 covers a base 200 of the electronic device and electrically connected to a ground of the electronic device to increase a grounding size, therefore decreasing noise affection. The cover 100 includes a bottom wall 10, a first sidewall 20, second sidewalls 30, limiting portions 40 and bent portions 50.

The bottom wall 10, the first sidewall 20 and the second sidewall 30 are substantially sheet in shaped. The first sidewall 20 is substantially perpendicular to the bottom wall 10. In at least one embodiment, a number of the second sidewall 30 is two, which are perpendicularly connected to opposite ends of the first sidewall 20. The bottom wall 10 is spaced between the two second sidewalls 30. In at least one embodiment, conjunctions between the bottom wall 10, the first sidewall 20 and the second sidewalls 30 are fillet angles, thereby decreasing sharpness of the cover 100.

The bottom wall 10 defines first connecting holes 12 and an expose hole 14. The first connecting holes 12 are configured to receive fixing pieces to fix the cover 100 to the base 200. The expose hole 14 is configured to expose a predetermined portion of the base 200, such as a connector 210. Two extend portions 31 are formed on ends of the second sidewalls 30 extending towards the opposite sides of the bottom wall 10. Each extend portion 31 defines a second connecting hole 32 and configured to receive portions of the base 200, such as protrusion columns 220. In at least one embodiment, the first connecting holes 12 and the second connecting holes 32 are coplanar and configured to connect to a same plane of the base 200.

The limiting portions 40 are arranged on the second sidewalls 30. In at least one embodiment, a number of the limiting portions 40 are four and each second sidewall 30 includes two limiting portions 40. Each limiting portion 40 is substantially sheet shaped and slightly protruded from the second sidewall 30 towards the bottom wall 10 and configured to hold the base 200.

The bent portions 50 are arranged on the first sidewall 20 and the second sidewalls 30. In at least one embodiment, a number of the bent portions 50 is four. Two bent portions 50 are arranged on opposite ends of the first sidewall 20, the other two bent portions 50 are arranged on the two second sidewalls 30, respectively. Each bent portion 50 on the second sidewalls 30 is located between the limiting portions 40. Each bent portion 50 is substantially U-shaped and extends outwardly and configured to contact ground portions, such as ground elastic pieces, of the electronic device to increase a ground size of the electronic device.

The cover 100 covers the base 200 of the electronic device and latches to the base 200 via the limiting portions 40. The bent portions 50 contact the ground portion of the electronic device to increase a ground size of the electronic device. In at least one embodiment, a frequency band of the signals transmitted by the electronic device is about 869-894 MHz, when the cover 100 is added to the electronic device, noise resonated by the electronic device at frequency of 875 MHz and 880 MHz is effectively decreased, and the communication quality could be increased.

It is believed that the embodiments and their advantages will be understood from the foregoing description, and it will be apparent that various changes may be made thereto without departing from the scope of the disclosure or sacrificing all of its advantages, the examples hereinbefore described merely being illustrative embodiments of the disclosure.

What is claimed is:

1. A cover for covering a base of an electronic device with ground portions, the cover comprising:
   a plurality of sidewalls;
   a plurality of limiting portions arranged on the plurality of sidewalls and protruding inwardly and away from the sidewall to latch to the base; and a plurality of bent portions arranged on the plurality of sidewalls and extending outwardly to contact ground portions of the electronic device;

a bottom wall, the bottom wall defining a plurality of first connecting holes, wherein fixing pieces are attached to the electronic base, and the first connecting holes receive fixing pieces to fix the cover to the base.

2. The cover as claimed in claim 1, wherein the cover is made of a metallic material and made by an integral molding technology.

3. The cover as claimed in claim 1, wherein the cover is a rectangular frame with an opening.

4. The cover as claimed in claim 1, wherein the plurality of sidewalls comprises a first sidewall having two ends spaced from each other and two second sidewalls, the two second sidewalls are each perpendicularly connected to one of the two opposite ends of the first sidewall.

5. The cover as claimed in claim 4, wherein the bottom wall is a sheet shaped, the bottom wall is perpendicularly connected to the first sidewall and spaced between the two second sidewalls.

6. The cover as claimed in claim 5, wherein the outer surface of the bottom wall, the first sidewall, and the second sidewalls intersect each other at fillet angles.

7. The cover as claimed in claim 5, wherein an exposed hole is defined in the bottom wall, the exposed hole exposes a predetermined portion of the base.

8. The cover as claimed in claim 7, wherein each second sidewall comprises two ends spaced from each other, wherein an extend portion is formed on one end, the extend portions on the two second sidewall extend towards opposite sides of the bottom wall, each extend portion defines a second connecting hole configured to receive portions of the base, the first connecting holes and the second connecting holes are coplanar and connected to a same plane of the base.

9. The cover as claimed in claim 4, wherein the limiting portions are arranged on the second sidewalls, the cover comprises four limiting portions, every two limiting portions being spaced from each other arranged on one second sidewall, each limiting portion is a sheet shaped and protrudes from the second sidewall.

10. The cover as claimed in claim 9, wherein the bent portions are arranged on the first sidewall and the second sidewalls, the cover comprises four bent portions, two bent portions are arranged on opposite ends of the first sidewall, the other two bent portions are arranged on the two second sidewalls; each bent portion on the second sidewalls is located between the limiting portions, each bent portion is U-shaped and extends outwardly and configured to contact ground portions.

11. An electronic device comprising:
abase; and
a cover for covering a base of an electronic device with ground portions, the cover comprising:
a plurality of sidewalls;
a plurality of limiting portions arranged on the plurality of sidewalls and protruding inwardly and away from the sidewall to latch to the base; and
a plurality of bent portions arranged on the plurality of sidewalls and extending outwardly to contact ground portions of the electronic device;
a bottom wall, the bottom wall defining a plurality of first connecting holes, wherein fixing pieces are attached to the electronic base, and the first connecting holes receive fixing pieces to fix the cover to the base.

12. The cover as claimed in claim 11, wherein the cover is made of a metallic material and made by an integral molding technology.

13. The cover as claimed in claim 11, wherein the cover is a rectangular frame with an opening.

14. The cover as claimed in claim 11, wherein the plurality of sidewalls comprises a first sidewall having two ends spaced from each other and two second sidewalls, the two second sidewalls are each perpendicularly connected to one of the two opposite ends of the first sidewall.

15. The cover as claimed in claim 14, wherein the bottom wall is sheet shaped, the bottom wall is perpendicularly connected to the first sidewall and spaced between the two second sidewalls.

16. The cover as claimed in claim 15, wherein the outer surface of the bottom wall, the first sidewall, and the second sidewalls intersect each other at fillet angles.

17. The cover as claimed in claim 15, wherein an exposed hole is defined in the bottom wall, the exposed hole exposes a predetermined portion of the base.

18. The cover as claimed in claim 17, wherein each second sidewall comprises two ends spaced from each other, wherein an extend portion is formed on one end, the extend portions on the two second sidewall extend towards opposite sides of the bottom wall, each extend portion defines a second connecting hole configured to receive portions of the base, the first connecting holes and the second connecting holes are coplanar and connected to a same plane of the base.

19. The cover as claimed in claim 14, wherein the limiting portions are arranged on the second sidewalls, the cover comprises four limiting portions, every two limiting portions being spaced from each other arranged on one second sidewall, each limiting portion is a sheet shaped and protrudes from the second sidewall.

20. The cover as claimed in claim 19, wherein the bent portions are arranged on the first sidewall and the second sidewalls, the cover comprises four bent portions, two bent portions are arranged on opposite ends of the first sidewall, the other two bent portions are arranged on the two second sidewalls; each bent portion on the second sidewalls is located between the limiting portions, each bent portion is U-shaped and extends outwardly and configured to contact ground portions.

* * * * *